United States Patent
Gehring

(10) Patent No.: US 6,940,121 B2
(45) Date of Patent: Sep. 6, 2005

(54) SEMICONDUCTOR MEMORY CELL

(75) Inventor: Oliver Gehring, Dresden (DE)

(73) Assignee: Infineon Technology AG, Munich (DE)

( * ) Notice: Subject to any disclaimer, the term of this patent is extended or adjusted under 35 U.S.C. 154(b) by 0 days.

(21) Appl. No.: 10/399,929

(22) PCT Filed: Sep. 19, 2001

(86) PCT No.: PCT/EP01/10834
§ 371 (c)(1),
(2), (4) Date: Dec. 3, 2003

(87) PCT Pub. No.: WO02/37575
PCT Pub. Date: May 10, 2002

(65) Prior Publication Data
US 2004/0071016 A1 Apr. 15, 2004

(30) Foreign Application Priority Data
Nov. 2, 2000 (DE) .......................... 100 54 172

(51) Int. Cl.⁷ ............................................ H01L 29/788
(52) U.S. Cl. ........................ 257/315; 257/314; 257/316; 257/320; 257/321; 257/322; 257/326; 438/201; 438/241; 438/257; 438/263; 438/266
(58) Field of Search ................................ 257/239, 261, 257/295, 298, 314–326

(56) References Cited

U.S. PATENT DOCUMENTS

| 4,803,176 | A |   | 2/1989 | Bower |          |
|-----------|---|---|--------|-------|----------|
| 5,598,367 | A | * | 1/1997 | Noble | 365/149  |
| 5,705,415 | A | * | 1/1998 | Orlowski et al. | 438/259 |
| 5,786,612 | A | * | 7/1998 | Otani et al. | 257/316 |
| 6,064,105 | A | * | 5/2000 | Li et al. | 257/510 |
| 6,147,378 | A | * | 11/2000 | Liu et al. | 257/316 |
| 6,344,393 | B1 | * | 2/2002 | Liu | 438/259 |

FOREIGN PATENT DOCUMENTS

| DE | 19811080 |   | 9/1999 |
| EP | 58158973 | * | 9/1983 |
| EP | 59082770 |   | 5/1984 |
| EP | 04079369 |   | 3/1992 |
| JP | 03 022485 |   | 1/1991 |
| JP | 03093276 |   | 4/1991 |
| JP | 04164372 |   | 6/1992 |

* cited by examiner

Primary Examiner—Andy Huynh
(74) Attorney, Agent, or Firm—Fish & Richardson P.C.

(57) ABSTRACT

A semiconductor memory cell includes a semiconductor substrate that defines a trench having trench walls. The semiconductor memory cell also includes a floating gate electrode positioned within the trench and insulated from the trench walls by a first insulation region; a control gate electrode surrounding the trench; and a second insulation layer on the surface of the semiconductor substrate. The semiconductor memory cell further includes a conductive layer positioned on the second insulation layer. The conductive layer includes a channel region positioned above the floating gate electrode. The semiconductor memory cell also includes a source region and a drain region. The source region and the drain region are each formed in the conductive layer. The source region and the drain region are also connected to the channel region.

12 Claims, 2 Drawing Sheets

SEMICONDUCTOR MEMORY CELL

FIELD OF INVENTION

The present invention relates to a semiconductor memory cell and a method for fabricating it.

BACKGROUND

Although applicable, in principle, to any desired semiconductor memory cells, the present invention and the problem area on which it is based are explained with regard to nonvolatile semiconductor memory cells using silicon technology.

FIG. 2 shows a diagrammatic illustration of the construction of a known nonvolatile memory cell using silicon technology.

In FIG. 2, reference symbol 1 designates a silicon semiconductor substrate of the p-conduction type, into which an n$^+$-type source region S and an n$^+$-type drain region D are introduced. A channel region CH lies between the source region S and the drain region D. A tunnel oxide TO is provided above the channel region CH, a floating gate FG being situated in turn above said tunnel oxide. A coupling oxide KO is provided on the floating gate FG, a control gate CG being situated above said coupling oxide.

During operation of this known nonvolatile memory cell, charge carriers are moved for tunneling through the tunnel oxide TO by the application of an external voltage between the control gate CG and the channel or the source/drain region S, D. In this case, the voltage of the control gate CG is transmitted capacitively via the coupling oxide KO to the floating gate FG. The present charge state of the floating gate FG determines the threshold voltage of the transistor, which ultimately comprises the stored information.

Competitiveness with regard to costs and performance of nonvolatile memory arrangements can only be ensured by advancing miniaturization. At the present time, internal voltages of up to 19 V are required in order to program or erase the known nonvolatile cells, as illustrated, for example, in FIG. 2. In order to handle voltages of this order of magnitude, it is necessary to expend a relatively large amount of chip area for the insulation (e.g. triple wells, "channel stop" counter-implantations, withdrawn diffusion regions, laterally enlarged insulation) and the internal voltage generation (charge pumps).

Increasing miniaturizations of the technologies of nonvolatile memories (flash, EEPROM) can only be achieved by lowering the programming voltage. The latter in turn is dependent on the coupling capacitance between the floating gate FG and the programming line (word line) or the control gate CG. A maximum coupling capacitance is desirable in this connection.

Furthermore, in the case of present-day memory generations, an integration between RAM memories (Random Access Memories) and NVM memories (nonvolatile memories) has never been seriously considered before on account of the complexity of the fabrication processes. Mixed production of DRAM and NVM technologies on a common equipment plant would currently require huge outlays with regard to equipment conversion and would be accompanied by poor equipment capacity utilizations and an increased outlay for production planning and process support.

The object of the present invention is to specify an improved semiconductor memory cell and a corresponding fabrication method, the coupling capacitance being increased.

SUMMARY

The idea on which the present invention is based consists in forming a cell in which the gate structure is accommodated in the substrate.

A known filled deep trench of DRAM technology is taken in order to form the floating gate therein. This type of known trench is optimized with regard to the capacitance, so that the coupling factor or the voltage punchthrough from the control gate to the floating gate can be significantly increased and, consequently, with the same tunnel-relevant voltage between channel and floating gate, it is possible to reduce the external voltage between channel and control gate.

This considerably reduces the amounts of area expended for lateral insulation. Moreover, the control gate can preferably be realized by simple doping reversal of the basic material of the semiconductor substrate (e.g. silicon).

A further advantage of the memory cell according to the invention and of the corresponding fabrication method is that mixed production as needed of DRAM and NVM technologies on a common equipment plant with minimal process support outlay is made possible. It thus becomes possible to integrate DRAM, logic and NVM technologies in one module. This additionally results in a minimization of the development outlay for subsequent shrink generations.

The fact that the control gate encloses the floating gate virtually completely, i.e. with the exception of the channel region at the surface, in the case of the memory cell according to the invention has the consequence that the coupling capacitance is maximized and the voltage requirement therefore decreases. New process steps are not required for fabricating the memory cells according to the invention, since, in particular, the formation of trenches or deep trenches is already well known from DRAM production.

In accordance with one preferred development, the control gate electrode is a doping region in the semiconductor substrate.

In accordance with a further preferred development, the floating gate electrode is a polysilicon filling of the trench.

In accordance with a further preferred development, the conductive layer is an epitaxial layer made of polysilicon.

In accordance with a further preferred development, STI trenches for insulation with respect to adjacent memory cells are provided beside the trench.

An exemplary embodiment of the invention is illustrated in the drawings and is explained in more detail in the description below.

DESCRIPTION OF THE DRAWINGS

In the figures, identical reference symbols designate identical or functionally identical constituent parts.

DESCRIPTION

Figure 1:
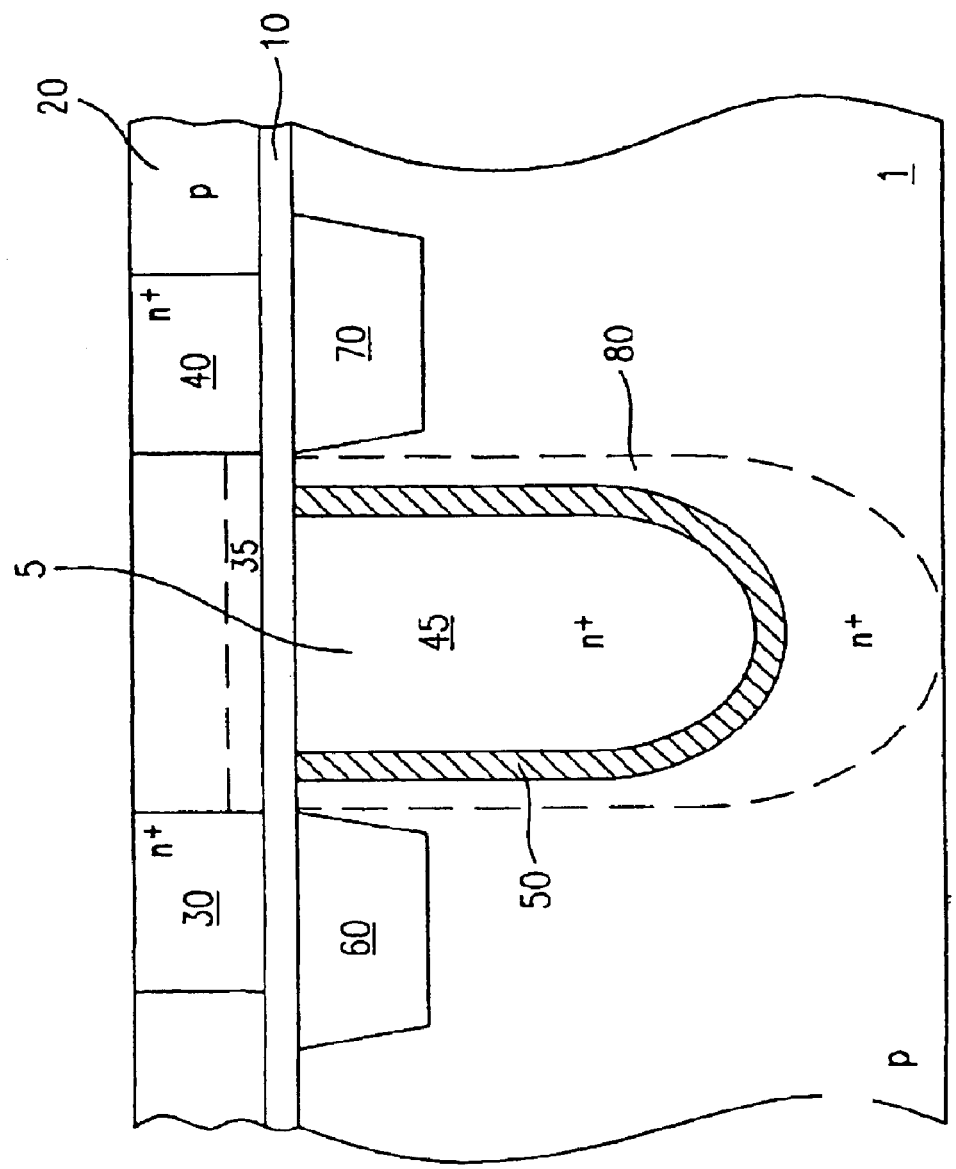
FIG. 1 shows a diagrammatic illustration of a semiconductor memory cell in accordance with a first embodiment of the present invention.

FIG. 1 shows a diagrammatic illustration of a semiconductor memory cell in accordance with a first embodiment of the present invention.

In FIG. 1, reference symbol 1 designates a silicon semiconductor substrate of the p-conduction type. A trench 5 is provided in the semiconductor substrate 1, an SiO$_2$ insulation layer 50 being situated on the trench wall of said trench. The first insulation layer 50 serves as the coupling oxide known per se. A floating gate electrode 45 made of polysilicon is introduced into the trench 5 and isolated from the trench wall by said insulation layer 50.

An n$^+$-type region serving as control gate electrode 80 is situated in the semiconductor substrate 1 around the trench 5. The connection of the control gate electrode 80 is not visible in FIG. 1 and, in this example, is routed toward to the rear from the plane of the drawing and at another location to the surface of the semiconductor substrate 1.

STI insulation regions 60, 70 STI=(Shallow Trench Isolation) are situated to the left and right of the trench 5 configured in this way.

Provided on the surface of the semiconductor substrate 1 is a second insulation layer 10 made of SiO$_2$ which serves as tunnel oxide. Provided on the second insulation layer 10 is a conductive layer 20 made of silicon, which forms a channel region 35 above the floating gate electrode 45. An n$^+$-type source region 30 and an n$^+$-type drain region 40 are situated beside the channel region 35.

Figure 2:
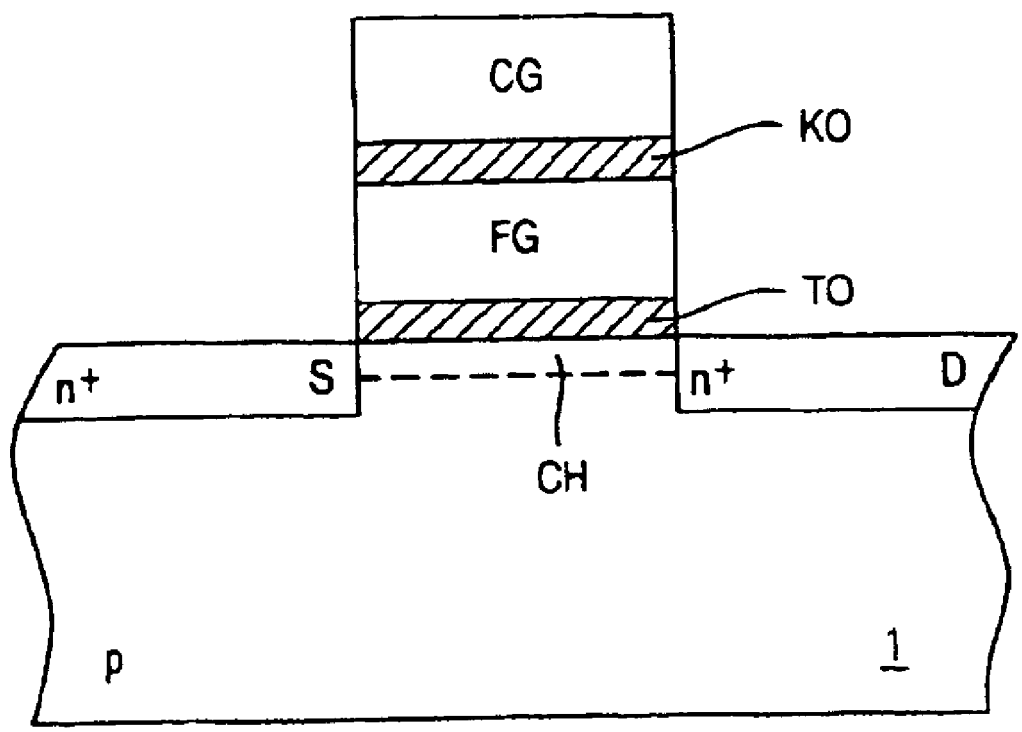
FIG. 2 shows a diagrammatic illustration of a known semiconductor memory cell.

The memory cell in accordance with this embodiment has the same functionality as the known memory cell in accordance with FIG. 2. However, its construction is virtually upside down, because the gate structure with the floating gate 45 and the control gate 80 is arranged below the channel region 35 in the semiconductor substrate 1.

A fabrication method for fabricating the memory cell shown in FIG. 1 is described below.

Firstly, the semiconductor substrate 1 of the p-conduction type is provided. This semiconductor substrate 1 may be a wafer substrate or some other substrate, for example an SOI substrate or an epitaxial substrate. According to known DRAM technology, the trench 5 is formed by an etching process in the substrate 1. The side walls of the trench 5 are oxidized in order to form the first insulation layer 50 and this is followed by suitable implantation or diffusion in order to form the control gate 80 as n$^+$-type region in the semiconductor substrate 1 around the trench 5. Afterward, n$^+$-doped polysilicon is deposited and planarized in order to form the floating gate 45 as trench filling. The STI trenches 60, 70 are formed to the left and right of the trench 5 according to known etching and filling technology.

In a further step, the second insulation layer 10, i.e. the tunnel oxide, is formed by thermal oxidation. An epitaxy step is preferably used to form the silicon layer 20 above the second insulation layer 10. There follows a masking and an introduction of n-type dopant for forming the source/drain region 30, 40.

As is evident, the fabrication of DRAMs and NVMs can be carried out simultaneously with this new fabrication method.

An example of application of such a process is the fabrication of hard-disk controllers. For these components, embedded DRAM modules are used for control and cache functions, whereas the control software is stored on a separate EEPROM. The technology proposed would enable the integration of this function on one module.

A further example of application is miniature computers (hand-held/notebooks). The latter are usually fabricated in embedded DRAM chips. With integrated technologies, the miniaturization can be advanced further here by incorporation of nonvolatile memories. Moreover, irksome booting is obviated, which creates time and energy advantages. The operating system and application programs, which have hitherto been provided on the hard disk, could be situated in the additionally integrated nonvolatile memory.

Although the present invention has been described above with reference to preferred exemplary embodiments, it is not restricted thereto but rather can be modified in diverse ways.

Although the present invention has been explained with reference to a nonvolatile memory cell using silicon technology, the invention is not restricted to silicon as basic material. Moreover, the other materials and method steps in the above exemplary embodiment are only specific possibilities from the many possibilities for realizing the memory cell according to the invention.

What is claimed is:

1. A semiconductor memory cell, comprising:
    a semiconductor substrate defining a trench having trench walls;
    a floating gate electrode positioned within the trench and insulated from the trench walls by a first insulation region;
    a control gate electrode surrounding the trench;
    a second insulaton layer on the surface of the semiconductor substrate;
    a conductive layer positioned on the second insulation layer, the conductive layer comprising a channel region positioned above the floating gate electrode;
    a source region formed in the conductive layer; and
    a drain region formed in the conductive layer, the source region and the drain region being connected to the channel region.

2. The semiconductor memory cell of claim 1, wherein the control gate electrode comprises a doped region in the semiconductor substrate.

3. The semiconductor memory cell of claim 1, wherein the floating gate electrode comprises a polysilicon filling the trench.

4. The semiconductor memory cell of claim 1, wherein the conductive layer comprises an epitaxial layer of polysilicon.

5. The semiconductor memory cell of claim 1, further comprising:
    a first shallow trench isolation (STI) region formed in the semiconductor substrate; and a second STI region formed in the semiconductor substrate, the trench being between the first and second STI regions;
    wherein the trenches isolate the semiconductor memory cell from other semiconductor memory cells.

6. The semiconductor memory cell of claim 1, wherein the control gate electrode encloses the floating gate electrode completely with the exception of the channel region at the surface.

7. A method of fabricating a memory cell on a semiconductor substrate, comprising:
    forming a trench within the semiconductor substrate, the trench having walls;
    forming a first insulation layer on the trench walls;
    forming a floating gate electrode in the trench and on the first insulation layer, the floating gate electrode being insulated from the trench walls by the first insulation layer;
    forming a control gate electrode in the semiconductor substrate around the trench;
    providing a second insulation layer on the surface of the semiconductor substrate;
    providing a conductive layer on the second insulation layer, the conductive layer comprising a channel region positioned above the floating gate electrode;

forming a source region in the conductive layer; and forming a drain region in the conductive layer, the source region and the drain region being connected to the channel region.

8. The method of claim 7, wherein forming the control gate electrode comprises reverse doping the semiconductor substrate.

9. The method of claim 7, wherein forming the floating gate electrode comprises filling the trench with polysilicon.

10. The method of claim 7, wherein forming the conductive layer comprises forming an epitaxial layer.

11. The method of claim 7 further comprising: forming shallow trench isolation (STI) regions in the semiconductor substrate near the trench, the STI regions insulating the semiconductor memory cell from other semiconductor memory cells.

12. The method of claim 7, wherein forming a control gate electrode includes forming a control gate electrode such that the control gate electrode encloses the floating gate electrode completely with the exception of the channel region at the surface.

* * * * *